US009687889B2

(12) United States Patent
Shibata et al.

(10) Patent No.: US 9,687,889 B2
(45) Date of Patent: Jun. 27, 2017

(54) CLEANING APPARATUS

(71) Applicant: Daifuku Co., Ltd., Osaka-shi (JP)

(72) Inventors: Junji Shibata, Gamo-gun (JP); Kazuya Omori, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 350 days.

(21) Appl. No.: 14/382,750

(22) PCT Filed: Feb. 28, 2013

(86) PCT No.: PCT/JP2013/055441
§ 371 (c)(1),
(2) Date: Sep. 3, 2014

(87) PCT Pub. No.: WO2013/133124
PCT Pub. Date: Sep. 12, 2013

(65) Prior Publication Data
US 2015/0020343 A1    Jan. 22, 2015

(30) Foreign Application Priority Data

Mar. 6, 2012  (JP) .................................. 2012-049502

(51) Int. Cl.
*B08B 5/02* (2006.01)
*B65G 45/22* (2006.01)
*H01L 21/67* (2006.01)
*H01L 21/677* (2006.01)
*G05D 7/06* (2006.01)
*B05B 15/08* (2006.01)
*B08B 15/02* (2006.01)

(52) U.S. Cl.
CPC .............. *B08B 5/023* (2013.01); *B05B 15/08* (2013.01); *B08B 5/02* (2013.01); *B08B 15/02* (2013.01); *B65G 45/22* (2013.01); *G05D 7/0629* (2013.01); *H01L 21/67051* (2013.01); *H01L 21/67733* (2013.01)

(58) Field of Classification Search
CPC B08B 5/02; B08B 5/023; B08B 15/02; H01L 21/67051; H01L 21/6773; B05B 15/08; G05D 7/0629; B65G 45/22
See application file for complete search history.

(56) References Cited

U.S. PATENT DOCUMENTS 5,303,482 A  *  4/1994  Yamashita ........ H01L 21/67769
34/218
5,363,867 A     11/1994  Kawano et al.
(Continued)

FOREIGN PATENT DOCUMENTS

EP    0552756 A1    7/1993
JP    53120851 A    10/1978
(Continued)

*Primary Examiner* — Robert Scruggs
(74) *Attorney, Agent, or Firm* — The Webb Law Firm

(57) ABSTRACT

A cleaning apparatus for a ceiling transport vehicle is provided which can be advantageously installed in a clean room. A cleaning apparatus for cleaning a ceiling transport vehicle includes an air blower for blowing air to the ceiling transport vehicle when the ceiling transport vehicle, which can travel along a travel rail provided on a ceiling side in a clean room, is stationary in a closed off space which is closed off from exterior space.

4 Claims, 6 Drawing Sheets

(56) References Cited

U.S. PATENT DOCUMENTS

| | | | |
|---|---|---|---|
| 5,522,412 A * | 6/1996 | Ohba | H01L 21/67051 |
| | | | 118/70 |
| 5,660,585 A | 8/1997 | Swoboda et al. | |
| 6,089,811 A * | 7/2000 | Watanabe | B23P 21/004 |
| | | | 198/347.3 |
| 6,238,283 B1 | 5/2001 | Matsuyama et al. | |
| 6,832,680 B1 | 12/2004 | Matsumura | |
| 2003/0173189 A1 | 9/2003 | Chen et al. | |
| 2006/0107968 A1 | 5/2006 | Schmidt et al. | |

FOREIGN PATENT DOCUMENTS

| | | |
|---|---|---|
| JP | 584747 Y2 | 1/1983 |
| JP | 6223492 A | 1/1987 |
| JP | 6226318 A | 2/1987 |
| JP | 0169601 U | 5/1989 |
| JP | 218156 A | 1/1990 |
| JP | 07002063 A | 1/1995 |
| JP | 08085695 A | 4/1996 |
| JP | 2003163250 A | 6/2003 |
| JP | 2006141397 A | 6/2006 |
| JP | 2008214084 A | 9/2008 |
| JP | 3153574 U | 8/2009 |
| JP | 20129520 A | 1/2012 |

\* cited by examiner

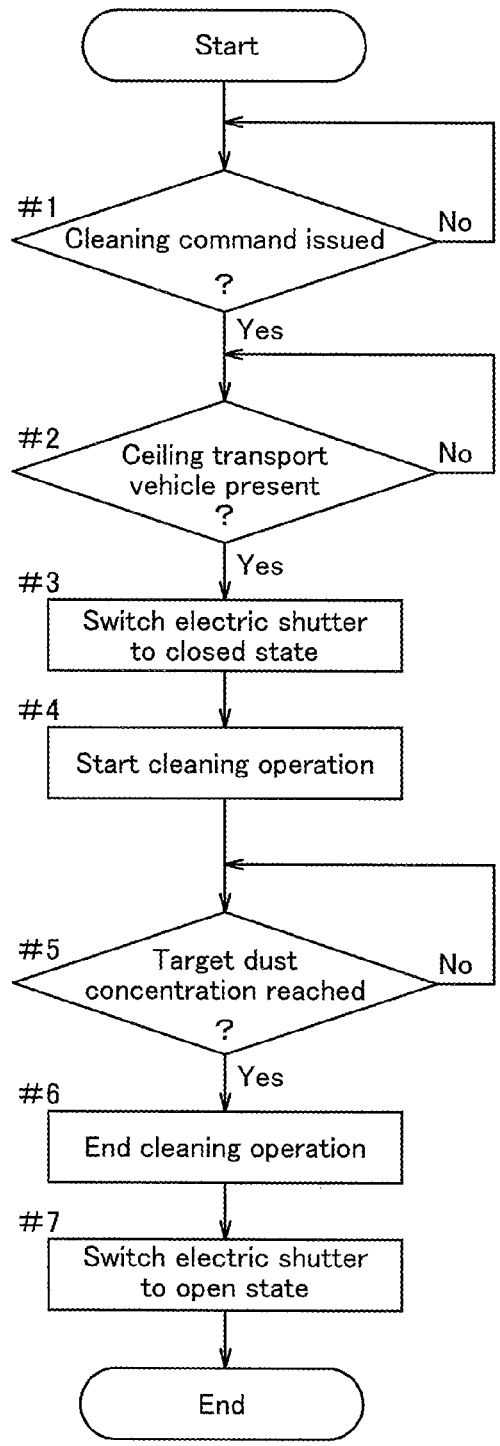

CLEANING APPARATUS

CROSS-REFERENCE TO RELATED APPLICATIONS

This application is the United States national phase of International Application No. PCT/JP2013/055441 filed Feb. 28, 2013, and claims priority to Japanese Patent Application No. 2012-049502 filed Mar. 6, 2012, the disclosures of which are hereby incorporated in their entirety by reference.

TECHNICAL FIELD

The present invention relates to a cleaning apparatus comprising an air blower for blowing air to a ceiling transport vehicle for traveling along a travel rail provided on a ceiling side in a clean room to clean the ceiling transport vehicle.

BACKGROUND ART

Cleaning apparatus such as one described above are apparatus that can clean a ceiling or overhead transport vehicle to which dust has accumulated or adhered as it travels within a cleaning room, and that have a partition which defines closed off space which is closed off from the exterior space in order to prevent the dust generated in the cleaning process from being dispersed into the clean room. And air blowers clean the ceiling transport vehicle in the closed off space defined by the partition.

As an example of such cleaning apparatus, there has been one which is provided along the travel path of the ceiling transport vehicle and in which the air blowers are configured to clean the ceiling transport vehicle while the vehicle continues to travel. (See, for example, Patent Document 1.)

CITATION LIST

Patent Literature

Patent Document 1: JP Publication of Application No. 2008-214084

SUMMARY OF THE INVENTION

Problems to be Solved by the Invention

With the arrangement of Patent Document 1 described above, dust generated in the cleaning process can be prevented from being dispersed into the clean room since the ceiling transport vehicle continues to travel along the travel path while the cleaning apparatus performs the cleaning operation. And in order for this to happen, the partition that defines the closed off space needs to be long so as to have a length that corresponds to the distance traveled by the moving ceiling transport vehicle during the cleaning process, which requires the cleaning apparatus to have a large structure. In addition, space needs to be utilized very efficiently in a clean room; thus, the arrangement of Patent Document 1 described above is not desirable since it requires a long area along the travel path to be occupied to install the partition.

In light of the background described above, it is desired to provide a cleaning apparatus for a ceiling transport vehicle which can be advantageously installed in a clean room.

Means for Solving the Problems

A cleaning apparatus in accordance with the present invention is a cleaning apparatus comprising an air blower for blowing air to a ceiling transport vehicle for traveling along a travel rail provided on a ceiling side in a clean room to clean the ceiling transport vehicle, characterized by a partition for defining closed off space which is closed off from exterior space, wherein the partition is configured to allow the ceiling transport vehicle to enter the closed off space by traveling, and wherein the air blower is configured to perform a cleaning operation on the ceiling transport vehicle that is stationary in the closed off space.

With the arrangement described above, the air blower can clean the ceiling transport vehicle with the ceiling transport vehicle stopped or stationary in the closed off space after entering the closed off space defined by the partition by traveling. Since the ceiling transport vehicle is stationary in the closed off space while being cleaned by the air blower, the closed off space only needs to be large enough to enclose the ceiling transport vehicle. Thus, the length of the partition in the travel direction only needs to be such as to correspond to the length, in the travel direction, of the ceiling transport vehicle, and thus can be compact; therefore, it can be installed advantageously in a clean room.

Thus, with the arrangement described above, a cleaning apparatus for a ceiling transport vehicle is provided which can be advantageously installed in a clean room.

Examples of preferred embodiments of the present invention are described next.

In an embodiment of the cleaning apparatus in accordance with the present invention, the partition is preferably provided with a fan filter unit which includes a fan for drawing in air in the closed off space, and for discharging air to outside the closed off space, and a filter for cleaning the air to be discharged.

With the arrangement described above, as air is blown from the air blower and the ceiling transport vehicle is cleaned, dust accumulated on the ceiling transport vehicle is blown away and floats in the closed off space. The air containing dust thus generated by the cleaning of the ceiling transport vehicle is drawn in by the fan of the fan filter unit, and is discharged as discharged air. The discharged air is cleaned by the filter of the fan filter unit, and the dust is removed.

Thus, dust generated by the cleaning of the ceiling transport vehicle can be prevented from dispersing into the exterior of the closed off space by means of a simple arrangement in which a fan filter unit, into which a fan and a filter are integrated, is provided to the partition. Accordingly, while designed to prevent contamination of the clean room, the arrangement can be prevented from becoming too complex.

In an embodiment of the cleaning apparatus in accordance with the present invention, the partition is preferably provided with an entrance opening through which the ceiling transport vehicle enters the closed off space, and an exit opening through which the ceiling transport vehicle exits the closed off space, wherein there are preferably provided an entrance opening opening and closing device (a device for opening and closing the entrance opening) which can be switched between an open state in which the entrance opening is opened and a closed state in which the entrance opening is closed; an exit opening opening and closing device (a device for opening and closing the exit opening) which can be switched between an open state in which the exit opening is opened and a closed state in which the exit opening is closed; a controller for controlling opening and closing operations of the entrance opening opening and closing device and the exit opening opening and closing device as well as a cleaning operation of the air blower; a dust concentration measuring device for measuring concentration of dust in the closed off space, wherein after controlling operations of the entrance opening opening and closing device and the exit opening opening and closing device to switch the entrance opening opening and closing device and the exit opening opening and closing device to the closed state with the ceiling transport vehicle stopped in the closed off space, the controller preferably controls an operation of the air blower to cause a cleaning operation of the air blower to be started, and wherein, after causing a cleaning operation of the air blower to be started, the controller is preferably configured to control operation of the air blower to end the cleaning operation of the air blower when the controller determines, based on measurement information of the dust concentration measuring device, that the concentration of dust in the closed off space has fallen to a set dust concentration.

With the arrangement described above, a cleaning operation of the air blower is started after the entrance opening opening and closing device and the exit opening opening and closing device have come to be in the closed state with the ceiling transport vehicle stopped or stationary in the closed off space. And air containing the dust generated by the cleaning of the ceiling transport vehicle by the air blower is cleaned by the fan filter unit, and is discharged from the closed off space to outside the closed off space. As the cleaning of the ceiling transport vehicle proceeds, the concentration of dust in the closed off space falls gradually.

The controller ends the cleaning operation of the air blower when it determines, based on measurement information of the dust concentration measuring device, that the concentration of dust in the closed off space has fallen to a set dust concentration. Therefore, by defining the set dust concentration in advance to be the dust concentration at the time when the dust accumulated on the ceiling transport vehicle is cleaned to a desired state, the operation of the air blower can be stopped when the ceiling transport vehicle is cleaned to the desired state.

The arrangement described above not only allows the air blower to operate reliably until the ceiling transport vehicle is in a desired cleaned state, but also prevents the ceiling transport vehicle from being stopped and restrained for cleaning purpose in the closed off space for longer than required.

In addition, by causing the exit opening opening and closing device to be in the open state after, or simultaneously with, or immediately before, causing the operation of the air blower to be stopped, the ceiling transport vehicle for which the cleaning has been completed can leave the closed off space by traveling to the outside. In addition, after the ceiling transport vehicle leaves, an arrangement can be made to wait for the next ceiling transport vehicle in a standby open and closed state in which the entrance opening opening and closing device is in the open state and the exit opening opening and closing device is in the closed state. Incidentally, when the cleaning apparatus is provided at an end of the travel path, the entrance opening opening and closing device would also function as the exit opening opening and closing device.

In an embodiment of the cleaning apparatus in accordance with the present invention, the air blower is preferably configured to include a plurality of nozzles for blowing air such that blow target locations can be changed.

With the arrangement described above, the blower nozzles provided to the air blower are such that the blow target locations can be changed and a plurality of the blower nozzles are provided; thus, the air blower can perform a cleaning operation on a plurality of locations on the ceiling transport vehicle while changing the blow target locations. Accordingly, by blowing air to the ceiling transport vehicle, with the plurality of blower nozzles arranged properly, and by changing the blow target locations of those blower nozzles, the locations that need to be cleaned in the ceiling transport vehicle can be properly cleaned without having to provide a blower nozzle individually for every location that needs to be cleaned in the ceiling transport vehicle.

In an embodiment of the cleaning apparatus in accordance with the present invention, a vertically moving device for maintenance is preferably provided that includes a casing which the ceiling transport vehicle traveling on the travel rail can enter, and that includes, within the casing, a vertically moving mechanism for moving the ceiling transport vehicle away toward a floor, wherein the closed off space is preferably defined by the casing as the partition, and wherein the air blower is preferably provided within the casing.

With the arrangement described above, the ceiling transport vehicle can be cleaned within the casing of the vertically moving device for maintenance provided in the ceiling transport facility; thus, the space, which corresponds to the floor area in the clean room that is occupied by the vertically moving device for maintenance, can be utilized efficiently.

BRIEF DESCRIPTION OF THE DRAWINGS

FIG. 7 is a flowchart for cleaning control.

DESCRIPTION OF EMBODIMENT

Next, embodiments of the cleaning apparatus in accordance with the present invention are described with reference to the drawings.

Figure 1:
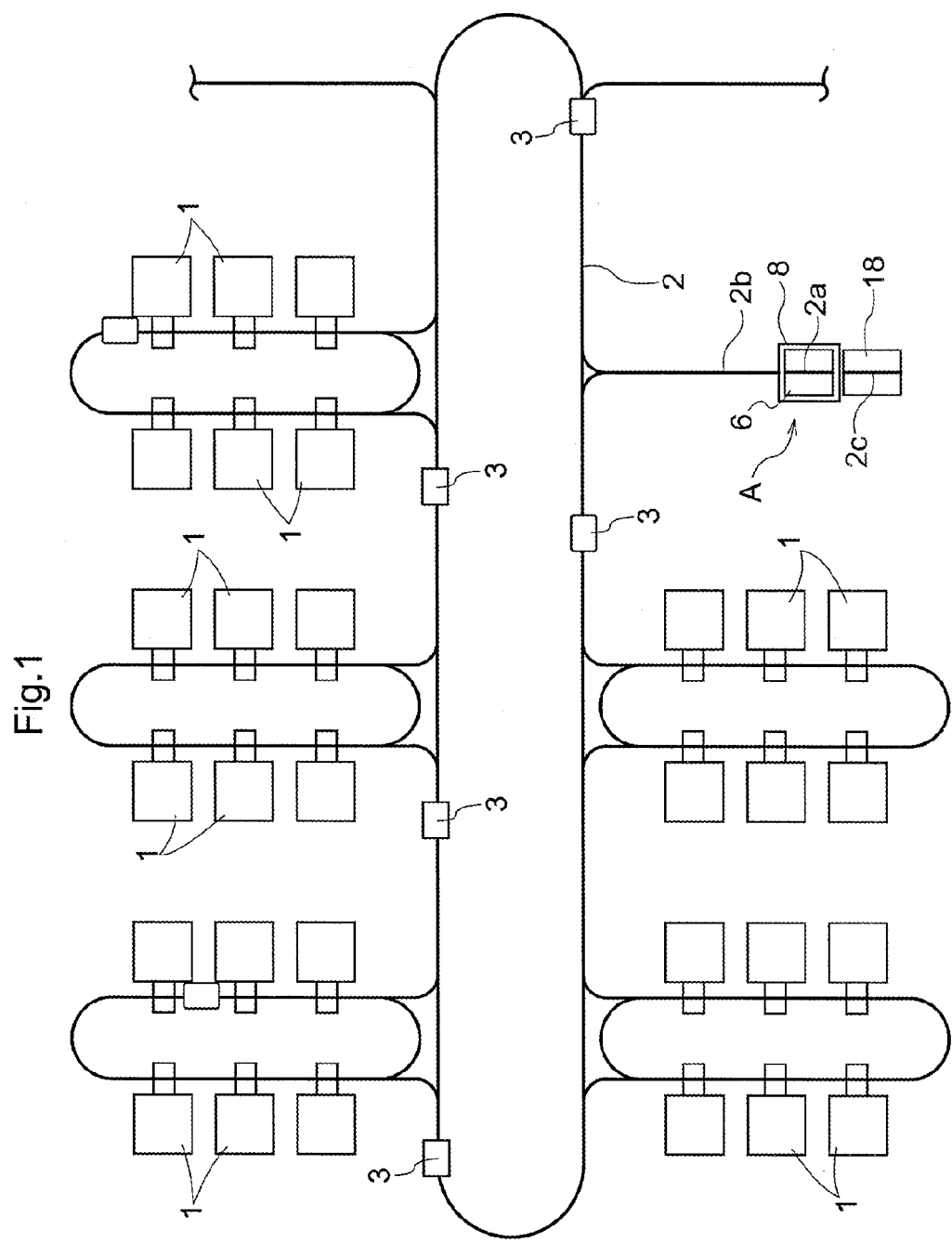
FIG. 1 is an overall plan view of a ceiling transport facility.

As shown in FIG. 1, travel rails 2 for allowing ceiling transport vehicles to travel are installed on the ceiling side along predetermined travel paths which are disposed to extend by way of, or along, a plurality of article processors 1. And the ceiling transport vehicles 3 which travel along predetermined travel paths are provided such that the vehicles 3 are guided and supported by the travel rails 2.

And the ceiling transport vehicle 3 is configured to transport an article from an article carrying in location (not shown) to an article processor 1, from an article processor 1 to another article processor 1, and from an article processor 1 to an article taking out location (not shown). The travel rails 2 described above are installed in a clean room. And the ceiling transport vehicle 3 transports, as a transported object, a substrate container in which a plurality of plates of semiconductor can be stored.

A travel portion 4 of the ceiling transport vehicle 3 is provided with travel wheels 5a which roll on the top surfaces of the travel rails 2, and guide wheels 5b which roll on lateral side surfaces of the travel rails 2. And the ceiling transport vehicle 3 is configured to travel along the predetermined travel path while being guided by the travel rails 2 by the virtue of the fact that the travel wheels 5a are driven and rotated by a travel motor M1.

Figure 6:
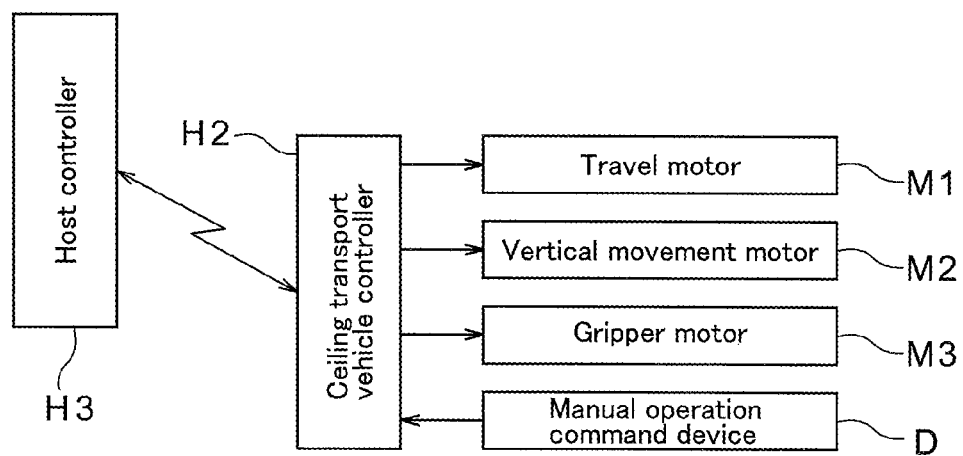
FIG. 6 is a control block diagram.

In addition, the ceiling transport vehicle 3 is provided with a vertically movable portion 6 which can grip an article and which can be vertically moved with respect to the travel portion 4. The vertically movable portion 6 is configured to be vertically moved by spooling and feeding out wires by drivingly rotating a rotatable drum (not shown) in a forward direction and reverse direction by means of a vertical movement motor M2 (see FIG. 6).

The vertically movable portion 6 includes a pair of grippers 7 which can grip flanges provided to an upper portion of the substrate container. The pair of grippers 7 have proximal end side portions that are pivotably connected such that distal end side portions can be moved away from each other and toward each other. The pair of grippers 7 are configured to be switched or moved by the gripper motor M3 between a gripping attitude in which the distal end portions are moved closer to each other to grip an article and a release attitude in which the distal end portions are spaced apart from each other to release the grip on the article.

When receiving a substrate container placed on a support platform (not shown) of an article processor 1, an empty ceiling transport vehicle 3 which is not supporting any substrate container is caused to be stopped at a target stop position which corresponds to the article processor 1. And, in that state, and after the vertically movable portion 6 is caused to be lowered to the height at which the pair of grippers 7 can grip the substrate container, the pair of grippers 7 are caused to grip the flanges of the substrate container placed on the support platform by switching the pair of grippers 7 from the release attitude to the gripping attitude. Subsequently, the vertically movable portion 6 is raised.

In addition, when unloading or delivering a substrate container onto a support platform of an article processor 1, the load-carrying ceiling transport vehicle 3 which is supporting the substrate container is caused to be stopped at a target stop position which corresponds to the article processor 1. And, in that state, and after the vertically movable portion 6 is caused to be lowered until the substrate container is received and supported by the support platform, the pair of grippers 7 are caused to release the grip on the substrate container by switching the pair of grippers 7 from the gripping attitude to the release attitude. Subsequently, the vertically movable portion 6 is raised.

The transport operation of the substrate container by the ceiling transport vehicle 3 is controlled by a ceiling transport vehicle controller H2 (see FIG. 6) based on transport commands issued from a superordinate host controller H3. The ceiling transport vehicle controller H2 is configured to be able to perform a maintenance operation control in which a ceiling transport vehicle 3 is caused travel to a ceiling transport vehicle extracting location A based, for example, on a manual operation command from a manual operation command device D (see FIG. 6) which consists of a terminal which can be connected to the ceiling transport vehicle controller H2.

As shown in FIG. 1, the ceiling transport vehicle extracting location A is defined in the travel path that branches off from the loop-shaped travel path in the predetermined travel paths. The travel rail vertically moving device 8 is installed in the ceiling transport vehicle extracting location A.

Figure 2:
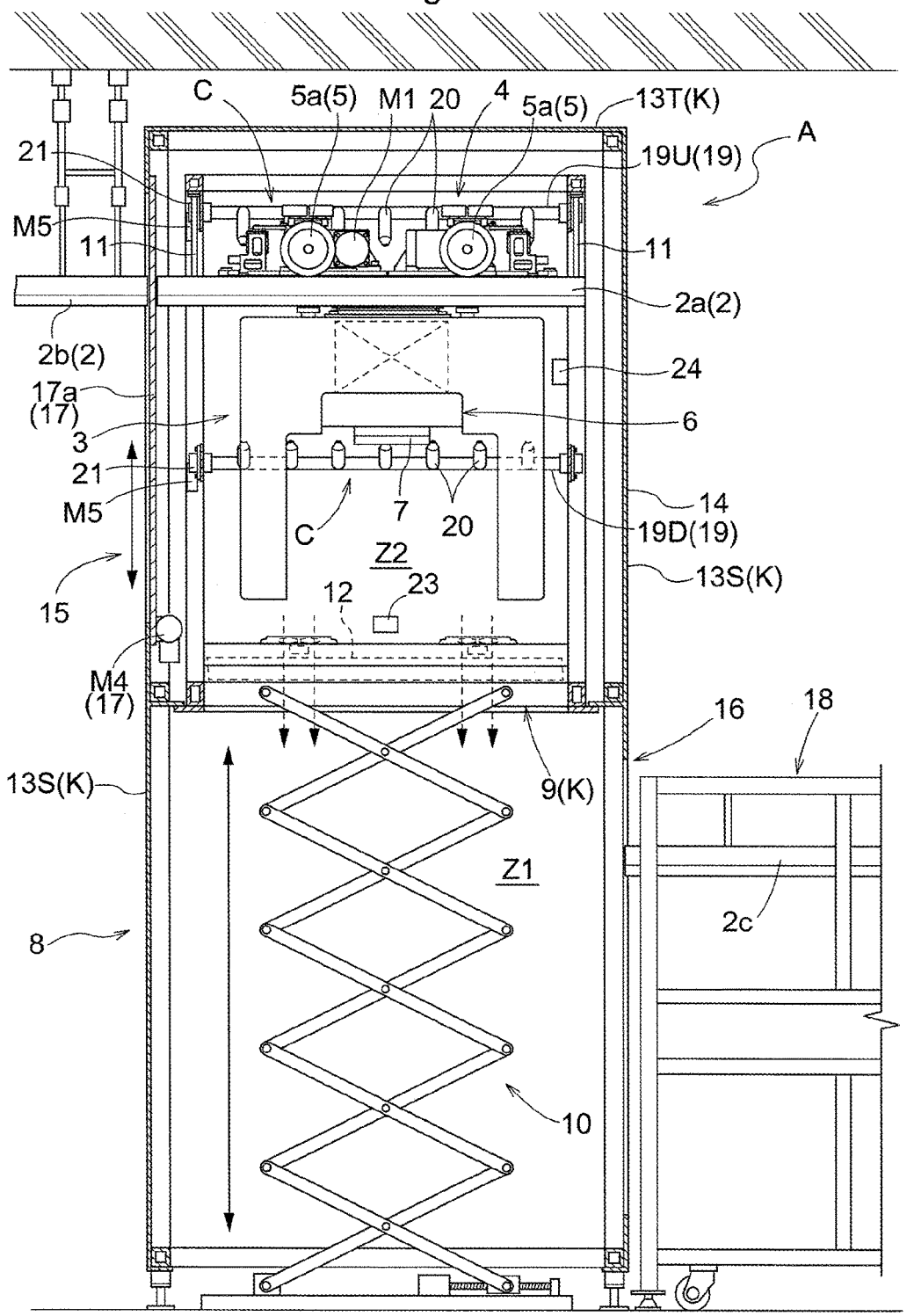
FIG. 2 is a partial vertical sectional side view of a vertically moving device for maintenance equipped with a cleaning apparatus.

And as shown in FIG. 2, the travel rail vertically moving device 8 is provided with travel rail portions 2a that correspond to the ceiling transport vehicle extracting location A in the travel rails 2 such that the travel rail portions 2a, with the ceiling transport vehicle 3 supported thereon, can be vertically moved between a transport vehicle travel height (see FIG. 2) at which the travel rail portions 2a are in series with travel rail main body portions 2b of the travel rails 2, and a transport vehicle extraction height at which the travel rail portions 2a are lowered toward the floor surface. This arrangement allows the ceiling transport vehicle 3 that has traveled to the ceiling transport vehicle extracting location A to be extracted, or moved out, to the floor side for maintenance. In other words, the travel rail vertically moving device 8 functions as a vertically moving device for maintenance having a vertical movement mechanism for moving the ceiling transport vehicle 3 out to the floor side.

The travel rail portions 2a are supported by the vertically movable body 9. And the vertically movable body 9 consists of a frame which is assembled from a plurality of vertical and horizontal frame material pieces. And the travel rail vertically moving device 8 is configured to be able to vertically move the travel rail portions 2a between the transport vehicle travel height and the transport vehicle extraction height by vertically moving the vertically movable body 9 by means of a pantograph-type vertical moving mechanism 10. Incidentally, as shown in FIG. 2, although the travel rail main body portions 2b are connected to and supported by the ceiling through support brackets 11, the travel rail portions 2a that correspond to the ceiling transport vehicle extracting location A in the travel rails 2 are connected to and supported by top portions in the vertically movable body 9 through the support brackets 11.

Two fan filter units 12 are disposed next to each other in a vehicle body lateral width direction of the ceiling transport vehicle 3 in a lower end portion of the vertically movable body 9 with each fan filter unit 12 constructed by assembling, into an integral unit, electric-powered blower fans which rotate about vertical axes and a plate-shaped dust removing filter which covers the blower fans. Here, the vehicle body lateral width direction is a direction which is perpendicular to both the travel direction and the vertical direction of the ceiling transport vehicle 3. These fan filter units 12 are operated when cleaning the ceiling transport vehicle 3 to clean the air within the cleaning space Z2 in which the ceiling transport vehicle 3 is located, and to discharge the air out to the exterior space Z1.

The vertically movable body 9 and the vertically moving mechanism 10 are disposed within a casing 14 of box shape having a framework of vertical columns and horizontal frames and having an upper surface panel 13T and side surface panels 13S. While not shown, a vertical movement command switch with which a worker issues command is provided in an exterior surface of the casing 14. And the vertically movable body 9 is actuated and raised by the virtue of the fact that the vertically moving mechanism 10 is actuated and extended in a rising direction based on a rising command from this vertical movement command switch.

And the vertically movable body 9 is actuated and lowered by the virtue of the fact that the vertically moving mechanism 10 is actuated and contracted in a lowering direction based on a lowering command.

A transport vehicle entrance opening 15 is formed in an upper portion of the side surface panel 13S disposed on the side that faces the travel rail main body portions 2b among the four side surface panels 13S. In addition, a transport vehicle extraction opening 16 is formed in a lower portion of the side surface panel 13S disposed on the side that is opposite the side surface panel 13S in which the transport vehicle entrance opening 15 is formed.

An electric shutter 17 which can open and close the transport vehicle entrance opening 15 is provided to the casing 14. The electric shutter 17 has a shutter main body 17a which consists of plate-shaped members having a thickness which is thinner than the dimension of the gap formed between the travel rail portions 2a and the travel rail main body portions 2b such that the shutter main body 17a can be vertically moved in a vertical posture. And the electric shutter 17 has a shutter opening and closing motor M4 for actuating to open and close this shutter main body 17a. This arrangement allows the electric shutter 17 to be switched between an open state in which the shutter main body 17a is located below the transport vehicle entrance opening 15 to open the transport vehicle entrance opening 15, and a closed state in which the shutter main body 17a is located at a height that corresponds to the height of the transport vehicle entrance opening 15 to close the transport vehicle entrance opening 15.

When the vertically movable body 9 is located at the transport vehicle travel height, closed space is formed by the bottom portion of the vertically movable body 9, the upper surface panel 13T and the side surface panels 13S of the casing 14 by causing the electric shutter 17 to be in the closed state. And the ceiling transport vehicle 3 is cleaned in this space by means of air blowers C described later. In other words, the cleaning space Z2 located on the upper side of the casing 14 functions as the closed off space. And the bottom portion of the vertically movable body 9 equipped with the fan filter units 12, the upper surface panel 13T and the side surface panels 13S of the casing 14 function as a partition K which forms, or defines, the closed off space which is closed off from the exterior space Z1. And a side surface panel 13S as the partition K is configured to allow the ceiling transport vehicle 3 to travel and enter the closed off space. In addition, in order to ensure the airtightness of the cleaning space Z2, it is preferable to suitably utilize sealing structure for sealing the gap between the peripheral portions of the vertically movable body 9 located at the transport vehicle travel height and the casing 14.

When a ceiling transport vehicle 3 to be cleaned or a ceiling transport vehicle 3 to be subjected to maintenance work enter into the travel rail vertically moving device, the vehicle passes through the transport vehicle entrance opening 15, as well as when the ceiling transport vehicle 3 leaves to outside the travel rail vertically moving device 8 after the completion of the cleaning or the maintenance work. As such, the transport vehicle entrance opening 15 functions both as an entrance opening and an exit opening. Also, the electric shutter 17 functions both as an entrance opening opening and closing device (a device for opening and closing the entrance opening) and an exit opening opening and closing device (a device for opening and closing the exit opening).

Incidentally, the travel rail vertically moving device 8 is provided with a maintenance carriage 18 which can travel on the floor side and which has ceiling transport vehicle transfer auxiliary rails 2c disposed at the same height as the travel rail portions 2a lowered to the transport vehicle extraction height. Thus, with the vertically movable body 9 lowered to the transport vehicle extraction height, the ceiling transport vehicle 3 is moved from the travel rail portions 2a, through the transport vehicle extraction opening 16, and to the ceiling transport vehicle transfer auxiliary rails 2c. And with the ceiling transport vehicle 3 supported by the ceiling transport vehicle transfer auxiliary rails 2c of the maintenance carriage 18, the maintenance carriage 18 can be moved to the location for performing maintenance work, etc.

Figure 3:
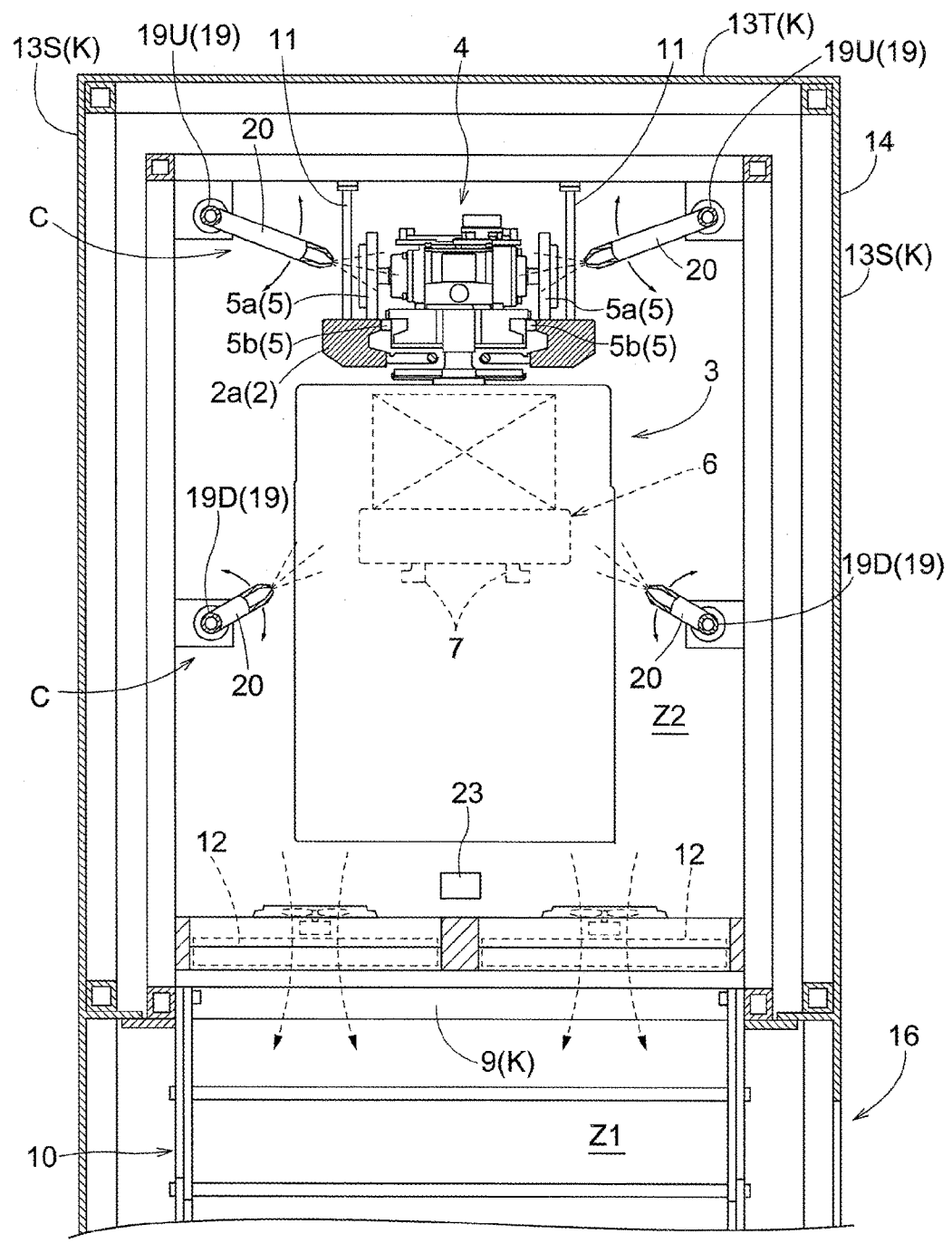
FIG. 3 is a partial vertical sectional front view of the vertically moving device equipped with the cleaning apparatus for maintenance.
Figure 4:
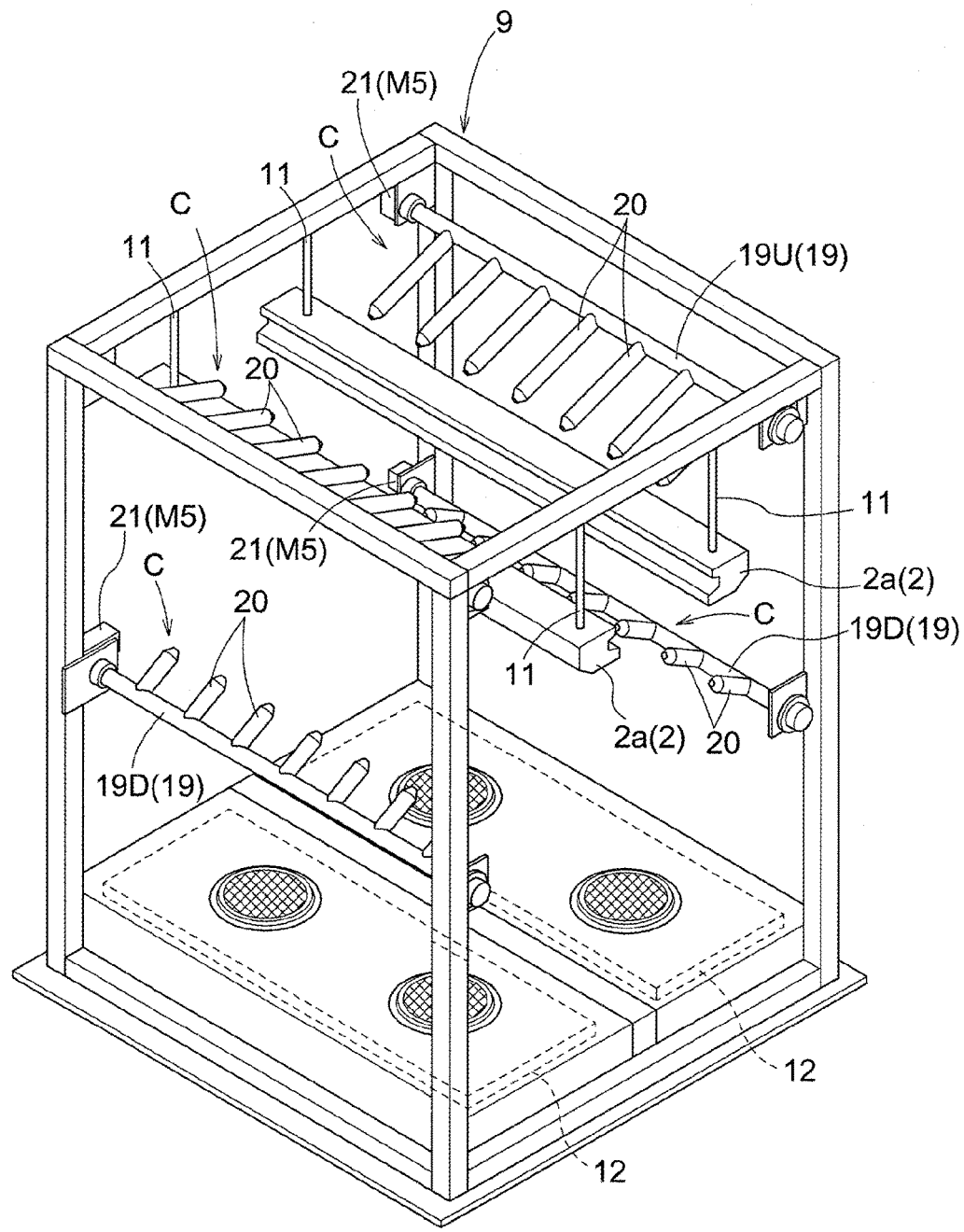
FIG. 4 is a partial vertical sectional perspective view of the vertically moving device equipped with the cleaning apparatus for maintenance.

As shown in FIGS. 2 and 3, the vertically movable body 9 has air blowers C for cleaning the ceiling transport vehicle 3 by blowing air to, or toward, the ceiling transport vehicle 3 in the cleaning space Z2. A plurality of air blowers C having a plurality of nozzles 20 which can blow air such that blow target locations can be changed. The air blowers C perform cleaning operations to a ceiling transport vehicle 3 which is stationary in the cleaning space Z2.

A plurality of nozzles 20 are supported by each of the four rotary operating shafts 19 which extend along a fore and aft direction of the ceiling transport vehicle 3 and which are arranged to be parallel to each other, such that the nozzles 20 are separately located in an axial direction (same direction as the fore and aft direction of the ceiling transport vehicle 3) and are supported to be rotatable in unison with the rotary operating shaft 19. The four rotary operating shafts 19 are rotatably supported by the vertically movable body 9 such that the rotary operating shafts 19 are spaced apart from each other in the vertical direction and the vehicle body width direction. A nozzle rotating motor M5 which drives and rotates the rotary operating shaft 19 through reduction gears 21 is attached at the location in the vertically movable body 9 in which an end of each rotary operating shaft 19 is located.

Cleaning air is supplied to the plurality of nozzles 20 through deformable supplying hoses by a cleaning air supplying device (not shown) provided on the ground side. This arrangement allows the nozzles 20 to receive supply of cleaning air from the cleaning air supplying device and to be moved vertically in unison with the vertically movable body 9. A blow switching valve 22 (see FIG. 5) which switches the plurality of nozzles 20 between a blowing state and a non-blowing state is provided in an intermediate location in a cleaning air supply passage extending from the cleaning air supplying device to the plurality of nozzles 20.

The two upper rotary operating shafts 19U disposed on the upper side among the four rotary operating shafts 19 are attached at a height that is higher than the height of the travel portion 4 of the ceiling transport vehicle 3 to be cleaned, and that is close to the travel portion 4. Here, the expression "close to" means that the distance of separation is less than or equal to the vertical dimension of the travel rails 2. Dust accumulated on the travel portion 4 can be accurately cleaned by rotating the upper rotary operating shafts 19U while air is blown from the nozzles 20 provided to the upper pair of rotary operating shafts 19U. The two lower rotary operating shafts 19D disposed on the lower side among the four rotary operating shafts 19 are attached at the height that is the same as, or is displaced by a set distance from, the height of the vertically movable portion 6 of the ceiling transport vehicle 3 to be cleaned. Dust accumulated on the vertically movable portion 6 and its actuator can be accurately cleaned by rotating the lower rotary operating shafts 19D while air is blown from the nozzles 20 provided to the lower pair of rotary operating shafts 19U.

In addition, the plurality of nozzles 20 are disposed such that their distal ends are close to the ceiling transport vehicle 3 to be cleaned in order to have sufficient cleaning effect, but are configured to be located and dimensioned such that their distal ends would not interfere with the ceiling transport vehicle 3 when rotated into any attitude by the rotary operating shaft 19.

A particle counter 23, which is known in the art, is provided within the casing 14 as a dust concentration measuring device for measuring the concentration of the dust in the cleaning space Z2 when the air blowers C are in operation. The particle counter 23 is disposed at a height that is higher than the vertically movable body 9 when located in the transport vehicle travel height, and that is lower than and close to the ceiling transport vehicle 3. This arrangement allows the particle counter 23 to measure the concentration of the dust contained in the air at an intermediate location in the path of the contaminated air drawn in by the fan filter units 12 located in the lower portion of the cleaning space Z2. The output signal of the particle counter 23 is inputted into the cleaning apparatus controller H1 (see FIG. 5).

Figure 5:
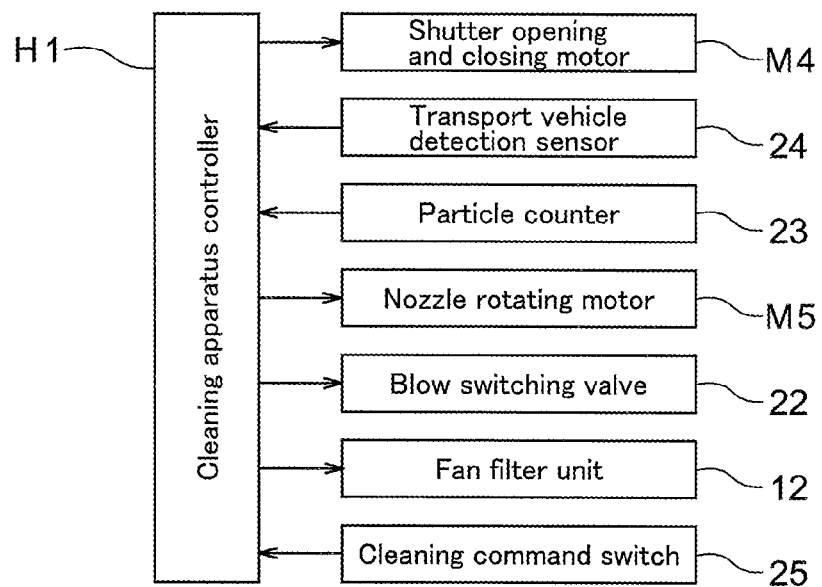
FIG. 5 is a control block diagram.

As shown in FIG. 5, the cleaning apparatus controller H1 is provided which functions as a controller for controlling cleaning operations of the air blowers C and opening and closing operations of the electric shutter 17. The cleaning apparatus controller H1 is configured to determine whether the ceiling transport vehicle 3 to be cleaned is present in a stationary state in the cleaning space Z2 based on detected information from a transport vehicle detection sensor 24 which can detect the ceiling transport vehicle 3 that is stopped or stationary in the cleaning space Z2. The transport vehicle detection sensor 24 is configured to be able to detect the ceiling transport vehicle 3 located at a cleaning location, i.e., the ceiling transport vehicle 3 supported by the travel rail portions 2a located at the transport vehicle travel height, and is preferably a distance measuring type optical sensor which can measure the distance to a detection target that is present in a detection target range.

And when a worker issues a cleaning command by means of the cleaning command switch 25, the cleaning apparatus controller H1 controls operation of the shutter opening and closing motor M4 based on this cleaning command to close the electric shutter 17 with the ceiling transport vehicle 3 stopped in the cleaning space Z2. And the cleaning apparatus controller H1 is configured to control operations of the air blowers C to cause the air blowers C to start the cleaning operations, and subsequently to end the cleaning operations of the air blowers C when the cleaning apparatus controller H1 determines that the concentration of dust in the cleaning space Z2 has fallen to a set dust concentration based on the measurement information from the particle counter 23.

A description is given next with reference to the flowchart shown in FIG. 7 with respect to the specific content of the cleaning control which the cleaning apparatus controller H1 performs when a worker operates the cleaning command switch 25 to issue a command after the ceiling transport vehicle 3 is caused to travel to the ceiling transport vehicle extracting location A by the worker operating the manual operation command device D to issue a command to cause the ceiling transport vehicle controller H2 to perform a maintenance operation control.

If the cleaning apparatus controller H1 determines at Step #1 that the cleaning command is issued, the cleaning apparatus controller H1 moves to Step #2 and determines whether the ceiling transport vehicle 3 to be cleaned is stopped in the cleaning space Z2 based on the detected information from the transport vehicle detection sensor 24.

If no ceiling transport vehicle 3 is stopped at the cleaning location, it waits until the ceiling transport vehicle 3 arrives at the cleaning location. Once the ceiling transport vehicle 3 is stopped at the cleaning location, it moves to Step #3 and controls actuation of the shutter opening and closing motor M4 to switch the electric shutter 17 to its closed state. And it starts the cleaning operation by means of the air blowers C at Step #4. That is, it causes: operations of the fan filter units 12 to be started; the blow switching valve 22 to be switched to the blowing state to cause cleaning air to be blown from the nozzles 20; the nozzle rotating motors M5 to be operated in the forward and reverse directions to cause the plurality of nozzles 20 to rotate in unison with the rotary operating shafts 19 and to cause the distal end portions of the nozzles 20 to be pivoted to reciprocate repeatedly within a set angular range.

After starting the cleaning operations by the air blowers C, the cleaning apparatus controller H1 monitors the dust concentration in the cleaning space Z2 at Step #5. Although the dust concentration in the cleaning space Z2 temporarily raises as cleaning operations continue and as the dust accumulated on the ceiling transport vehicle 3 disperses out to the cleaning space Z2, the dust concentration subsequently falls gradually due to the cleanup function of the fan filter units 12.

The cleaning apparatus controller H1 moves to Step #6 and ends the cleaning operations by the air blowers C if the dust concentration in the cleaning space Z2 is determined to have fallen to a target dust concentration based on the measurement information from the particle counter 23. That is, it causes: the operations of the fan filter units 12 to be stopped; and the blow switching valve 22 to be switched to the non-blowing state to cause the blowing of cleaning air from the nozzles 20 to be stopped. Subsequently, it controls actuation of the nozzle rotating motor M5 so that the plurality of nozzles 20 are in the stand-by positions, i.e., so that the rotation phase angle of the rotary operating shafts 19 are at the initial phases. And it controls actuation of the shutter opening and closing motor M4 at Step #7 to cause the electric shutter 17 to be switched to the open state.

In order to return the ceiling transport vehicle 3, on which the cleaning operation has been completed in this manner, to the transport operation of the substrate container, information is transmitted to the host controller H3 by means of the manual operation command device D to the effect that the ceiling transport vehicle 3 has become assignable (it can be selected as the ceiling transport vehicle 3 for an article transport operation). In addition, when performing maintenance work on the ceiling transport vehicle 3 immediately following the cleaning operation, a lowering command is issued by means of a vertical movement command switch (not shown) provided in an outer surface of the casing 14 to lower the vertically movable body 9 to the transport vehicle extraction height. And the ceiling transport vehicle 3 may be moved to, for example, a location where maintenance work is performed by moving it to the maintenance carriage 18.

[Alternative Embodiments]

While the invention made by the inventors is specifically described above based on the embodiment of the invention, the present invention is not limited to the embodiment described above. And various modifications may be made without departing from its spirit. Examples of alternative embodiments of the present invention are described.

(1) In the embodiment described above, an example is described in which the partition of the cleaning apparatus for the ceiling transport vehicle has an opening that functions both as an entrance opening and an exit opening. However, the partition may be one that has an entrance opening and an exit opening individually. That is, the cleaning apparatus may be of a pass-through type in which the partition may be provided in an intermediate location of the travel path such that the travel path of the ceiling transport vehicle extends through the partition, and in which an entrance opening and an exit opening are provided at the front and back ends, in the travel direction, of the partition. Also, in the embodiment described above, an example is described in which the cleaning apparatus is disposed within the partition arranged vertically on the floor. However, the partition may be suspended and supported from the ceiling.

(2) In the embodiment described above, an example is described in which the air blowers are provided in the casing for the vertically moving device for maintenance. However, the air blowers may be provided in a device exclusively for cleaning, instead.

(3) In the embodiment described above, an example is described in which the ceiling transport vehicle is caused to travel to the cleaning location by a manual operation command issued by a worker. However, instead of this arrangement, a managing device for managing the travel of ceiling transport vehicles (for example, it may be the ceiling transport vehicle controller H2 in the embodiment described above) may manage the accumulative travel amount for each of a plurality of ceiling transport vehicles to control travel of the ceiling transport vehicles so as to cause a ceiling transport vehicle, for which the accumulative travel amount has reached a set travel amount defined to determine the timing for cleaning, to travel to the cleaning apparatus.

Also, in place of the condition of whether the set travel amount defined to determine the timing for cleaning has been reached, the managing device may define a plurality of locations or a single location for travel amount measurement in the travel path, and may be configured to determine the timing of cleaning based on the number of times the location or locations for travel amount measurement has been, or have been, passed. In this case, a passage detecting device which consisted of an optical sensor etc. may be provided at the location or locations for travel amount measurement so that the managing device for managing the travel of the ceiling transport vehicle may manage the number of times each ceiling transport vehicle passed the location or locations for travel amount measurement based on the detected information of the passage detecting device.

(4) In the embodiment described above, an example is described in which, after causing the cleaning operations of the air blowers to start, the controller for controlling the cleaning operation of the air blowers ends the cleaning operations of the air blowers if the controller determines that the concentration of the dust in the closed off space has fallen to a set dust concentration based on the measurement information of the dust concentration measuring device. However, it may be one that, after causing the cleaning operations of the air blowers to start, ends the cleaning operations of the air blowers when a set time period has elapsed as measured by a timer.

(5) In the embodiment described above, an example is described in which the air blowers are ones in which their blow target locations can be changed by rotating the nozzles. However, instead of, or in addition to, this arrangement, they may be such that the blow target locations may be changed by moving the nozzles vertically or right and left. In addition, the nozzles may be such that the blow target locations cannot be changed.

(6) In the embodiment described above, an example is described in which the air blowers are provided such that they can be vertically moved in unison with the vertically movable body vertically moved by the vertically moving mechanism. However, the air blowers may be fixed to the partition instead. In this case, the nozzles may be such that the blow target locations may, or may not, be changed.

DESCRIPTION OF REFERENCE NUMERALS AND SYMBOLS

C Air blower
K Partition
Z1 Exterior space
Z2 Closed off space
H1 Controller
2 Travel rails
3 Ceiling transport vehicle
10 Vertically moving mechanism
12 Fan filter unit
14 Casing
15 Entrance opening, Exit opening
17 Entrance opening opening and closing device, Exit opening opening and closing device
20 Nozzle
23 Dust concentration measuring device

The invention claimed is:

1. A cleaning apparatus comprising an air blower for blowing air to a ceiling transport vehicle for traveling along a travel rail provided on a ceiling side in a clean room to clean the ceiling transport vehicle,
   comprising
   a partition for defining closed off space which is closed off from exterior space, and
   a vertically moving device for maintenance having a casing which the ceiling transport vehicle traveling on the travel rail can enter, and that includes, within the casing, a vertically moving mechanism for moving the ceiling transport vehicle away from the ceiling side toward a floor,
   wherein the partition is configured to allow the ceiling transport vehicle to enter the closed off space by traveling,
   wherein the closed off space is defined by the casing as the partition,
   wherein the air blower is provided within the casing, and
   wherein the air blower performs a cleaning operation on the ceiling transport vehicle that is stationary in the closed off space.

2. The cleaning apparatus as defined in claim 1, wherein the partition is provided with a fan filter unit which includes a fan for drawing in air in the closed off space and for discharging air to outside the closed off space, and a filter for cleaning the air to be discharged.

3. The cleaning apparatus as defined in claim 2, wherein the partition is provided with an entrance opening through which the ceiling transport vehicle enters the closed off space, and an exit opening through which the ceiling transport vehicle exits the closed off space,
   wherein there are provided an opening and closing device corresponding to the entrance opening which can be switched between an open state in which the entrance opening is opened and a closed state in which the entrance opening is closed; an opening and closing device corresponding to the exit opening which can be switched between an open state in which the exit opening is opened and a closed state in which the exit opening is closed; a controller for controlling opening and closing operations of the opening and closing device corresponding to the entrance opening and the opening and closing device corresponding to the exit opening as well as a cleaning operation of the air blower; a dust concentration measuring device for measuring concentration of dust in the closed off space, wherein after controlling operations of the opening and closing device corresponding to the entrance opening and the opening and closing device corresponding to the exit opening to switch the opening and closing device corresponding to the entrance opening and the opening and closing device corresponding to the exit opening to the closed state with the ceiling transport vehicle stopped in the closed off space, the controller controls an operation of the air blower to cause a cleaning operation of the air blower to be started, and wherein, after causing a cleaning operation of the air blower to be started, the controller is configured to control operation of the air blower to end the cleaning operation of the air blower when the controller determines, based on measurement information of the dust concentration measuring device, that the concentration of dust in the closed off space has fallen to a set dust concentration.

4. The cleaning apparatus as defined in claim 1, wherein the air blower is configured to include a plurality of nozzles for blowing air such that blow target locations can be changed.

\* \* \* \* \*